United States Patent [19]

Oyoshi et al.

[11] Patent Number: 5,234,843
[45] Date of Patent: Aug. 10, 1993

[54] METHOD OF MAKING A SEMICONDUCTOR FILM WHERE THE HYDROGEN AND/OR FLUORINE IS RELEASED PRIOR TO ION BEAM CRYSTALLIZATION

[75] Inventors: Keiji Oyoshi; Tomonori Yamaoka, both of Tsukuba, Japan

[73] Assignee: Nippon Sheet Glass Co., Ltd., Osaka, Japan

[21] Appl. No.: 836,796

[22] Filed: Jan. 31, 1992

[30] Foreign Application Priority Data

Feb. 8, 1991 [JP] Japan .................... 3-39441

[51] Int. Cl.$^5$ ........................... H01L 21/265
[52] U.S. Cl. ..................... 437/24; 437/108; 437/109
[58] Field of Search ............ 437/24, 108, 109; 148/DIG. 48; 156/600, 603

[56] References Cited

FOREIGN PATENT DOCUMENTS 250621 11/1991 Japan .

OTHER PUBLICATIONS

H. A. Atwater, et al "Ion-bombardment-enhanced grain growth in germanium, silicon, and gold thin films" J. Appl. Phys 64 (5), Sep. 1, 1988, pp. 2337-2353.

Primary Examiner—Brian E. Hearn
Assistant Examiner—Linda J. Fleck
Attorney, Agent, or Firm—Woodcock Washburn Kurtz Mackiewicz & Norris

[57] ABSTRACT

Provided herein is a process for producing a polycrystalline semiconductor film at a low temperature. The process comprises the steps of depositing on a glass substrate by plasma CVD an amorphous silicon film containing the crystal phase as well as hydrogen, heating the film using a heater, thereby releasing hydrogen from the film, and growing the crystal phase by silicon ion implantation, thereby changing the amorphous silicon film into a polycrystalline silicon film containing crystal grains. The releasing of hydrogen from the amorphous silicon film permits the polycrystalline silicon film to be formed at a lower temperature than before without the growth of crystal phase being inhibited.

1 Claim, 1 Drawing Sheet

METHOD OF MAKING A SEMICONDUCTOR FILM WHERE THE HYDROGEN AND/OR FLUORINE IS RELEASED PRIOR TO ION BEAM CRYSTALLIZATION

BACKGROUND OF THE INVENTION

1. Field of the Invention

The present invention relates to a process for producing a polycrystalline semiconductor film, more particularly, to a process for forming at a low temperature by ion beam induced crystal growth a polycrystalline semiconductor film having a controlled uniform grain size.

2. Description of the Prior Art

Much has been reported about the ion beam induced crystal growth. An example is the solid phase epitaxial growth of amorphous silicon on a silicon substrate by ion implantation. (J. Nakata and K. Kajiyama, Jpn. J. Appl. Phys. 21 (1982) Suppl. 21-1, p. 211, and many others.)

There has been reported some example about ion implantation into a semiconductor film on a glass substrate. This process is designed to increase the grain size of a silicon or germanium film formed on a silica glass substrate by performing silicon or germanium ion implantation while heating them. (H. A. Atwater et al., J. Appl. Phys. 64 (1988) p. 2337)

There has also been reported some example about the production of a polycrystalline semiconductor film having a controlled uniform grain size. The production process involves the formation of an amorphous semiconductor film containing a crystal phase and the subsequent selection and/or growth of the crystal phase by ion implantation.

The above-mentioned processes which employ ion beams are advantageous over other processes in that they permit the solid phase growth at low temperatures. Therefore, they are expected to make it possible to process semiconductors at a lower temperature than before. They are also expected to be applied to the production of three-dimensional integrated circuits. Particularly, the combination of ion beam induced crystal growth and plasma CVD permits the formation of a polycrystalline semiconductor film at low temperatures.

One of the above-mentioned conventional processes (which involves the formation by plasma CVD of an amorphous semiconductor film containing a crystal phase and the subsequent selection and/or growth of the crystal phase by ion implantation) has a disadvantage that the film formed by plasma CVD contains about 10% hydrogen and/or fluorine (originating from the raw material gas $SiH_4$ or $SiF_4$ in the case of silicon film). It has been found that hydrogen and fluorine inhibit the ion beam induced crystal growth. Thus the presence of hydrogen and fluorine poses a serious problem with crystal growth. That is, the semiconductor film containing hydrogen and fluorine becomes amorphous without crystal growth when irradiated with an ion beam under the condition that the crystal phase in a semiconductor film will grow in the absence of hydrogen and fluorine. (The condition for crystal growth is attained by heating the substrate at 50°–800° C. using a heater or by ion implantation which heats the silicon film to 220° C. or above.)

OBJECTS AND SUMMARY OF THE INVENTION

The present invention was completed to solve the above-mentioned problems. Accordingly, it is an object of the present invention to provide a process for producing a polycrystalline semiconductor film at a low temperature which has never been employed in the conventional process.

The present invention is embodied in a process for producing a semiconductor film by ion beam induced crystal growth, said process comprising depositing by plasma CVD an amorphous film containing a crystal phase, carrying out a step of releasing hydrogen and/or fluorine from said film, and selecting and/or growing the crystal phase by ion implantation.

The above and other objects, features, and advantages of the present invention will become readily apparent from the following detailed description thereof which is to be read in connection with the accompanying drawing in which the same or corresponding parts are identified by the same reference numerals in the several views.

DETAILED DESCRIPTION OF A PREFERRED EMBODIMENT

According to the process of the present invention, a semiconductor film is produced in three stages. In the first stage, an amorphous semiconductor film containing a crystal phase is deposited by plasma CVD. In the second stage, the amorphous semiconductor film is freed of hydrogen and/or fluorine, with the crystal phase left intact. In the third stage, the amorphous semiconductor film undergoes ion beam induced crystal growth.

The removal of hydrogen and/or fluorine may be accomplished by heating with a heater, lamp, or laser beam. The maximum rate of removal may be achieved at 400°–600° C. The preferred heating temperature is lower than 600° C. In other words, it is lower than the temperature at which the ordinary CVD method is carried out. (Processing at a low temperature is the feature of the present invention.) The practical lower limit of the heating temperature is 150° C. It will take a longer time to release hydrogen and/or fluorine at an excessively low heating temperature.

After the removal of hydrogen and/or fluorine, a polycrystalline semiconductor film is formed by ion beam induced crystal growth which is based on ion implantation with a focused ion beam or through a mask. Thus there is obtained a polycrystalline semiconductor film with uniform quality and controlled size and position.

According to the process of the present invention, which involves the deposition of a semiconductor film by plasma CVD and the formation of polycrystals in the semiconductor film by ion beam induced crystal growth, it is possible to produce a polycrystalline semiconductor film at a lower temperature than before.

In addition, according to the process of the present invention, the semiconductor film deposited by plasma CVD is heated so as to release hydrogen and/or fluorine from the semiconductor film, because hydrogen and/or fluorine remaining in the semiconductor film inhibit the movement of crystal defects, which plays an important role in ion beam induced crystal growth, and hence prevents the crystal growth.

The invention will be described in more detail with reference to the accompanying drawing.

Figure 1A:
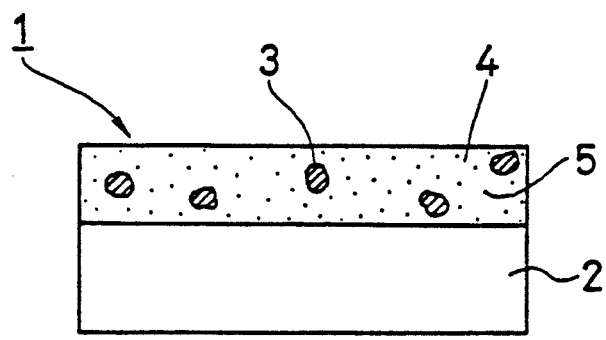
FIGS. 1a, 1b, and 1c are a process flow diagram showing an embodiment (production of a semiconductor film) of the present invention.

FIG. 1 is a process flow diagram showing an embodiment (production of a semiconductor film) of the present invention. Referring to FIG. 1(a), there is shown a sample 1 which is composed of a substrate 2 of silica glass or alkaline earth-alumina borosilicate glass ("7059 Glass" made by Corning) and a 150 nm thick amorphous silicon film 4 formed thereon from silane gas by plasma CVD. The amorphous silicon film 4 contains the crystal phase 3 and hydrogen 5.

Figure 1B:
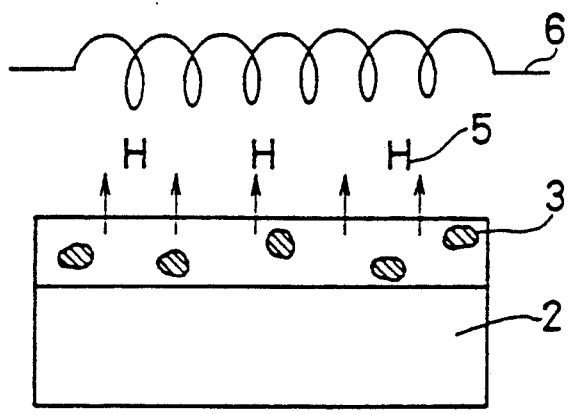

The sample 1 was heated in nitrogen atmosphere at 400° C. for 3 hours using a heater 6 so as to release hydrogen 5 from the amorphous silicon film 4 as shown in FIG. 1(b). It was found by infrared absorption that this heat treatment reduced the hydrogen content from about 10% to 1% or less.

Figure 1C:
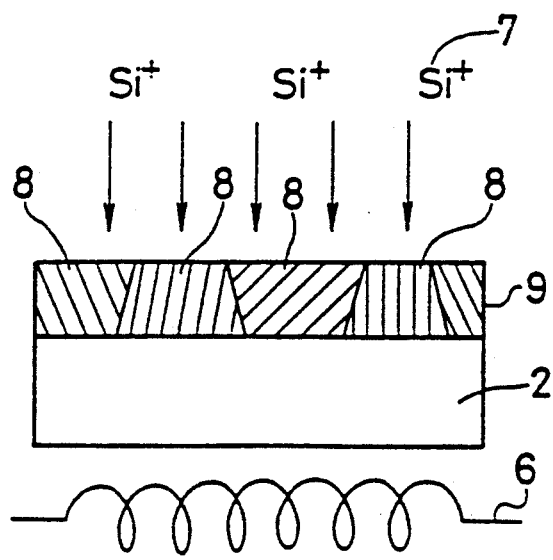

Subsequently, the sample 1 was given silicon 7 by ion implantation to grow the crystal phase 3 under the following conditions as shown in FIG. 1(c).

Accelerating energy: 180 keV
Amount of implantation: $5 \times 10^{16}$ ions/cm$^2$,
Beam current density: 1 $\mu$A/cm$^2$,
Substrate temperature: 350° C.

The sample was observed by a transmission electron microscope and examined by transmission electron beam diffraction before and after the ion implantation. It was found that the silicon film 4 had changed from an amorphous film containing the crystal phase about 30 nm in size into a polycrystalline silicon film 9 composed of crystal grains 8 about 200 nm in size.

For comparison, the same procedure as mentioned above was repeated except for the heat treatment. It was found that the silicon film 4 had remained amorphous and the crystal phase had disappeared after ion implantation.

As mentioned above, the process of the present invention involves an additional step of releasing hydrogen and/or fluorine from the deposited amorphous film containing the crystal phase. Owing to this additional step, the process of the present invention permits a polycrystalline semiconductor film to be produced at a lower temperature than before without the growth of crystal phase being inhibited. With the process of the present invention, it is possible to use those substrates which were not suitable for semiconductors in the conventional process which needed a high temperature because they are liable to thermal deformation and diffusion of the constituting elements. Thus the process of the present invention can be applied to form polycrystalline thin film transistors for liquid crystal display on a glass substrate having a low glass transition point which is not suitable for the convention process. Moreover, the process of the present invention can be applied to the production of three-dimensional integrated circuits.

Having described a specific preferred embodiment of the present invention with reference to the accompanying drawing, it is to be understood that the invention is not limited to that precise embodiment, and that various changes and modifications may be effected therein by one skilled in the art without departing from the scope or spirit of the invention as defined in the appended claim.

What is claimed is:

1. A process for producing a semiconductor film by ion beam induced crystal growth, said process comprising depositing by plasma CVD an amorphous film containing a crystal phase, carrying out a step of releasing hydrogen and/or fluorine from said film, and subsequently selecting and/or growing the crystal phase by ion implantation, wherein said step of releasing hydrogen and/or fluorine from said film occurs before any ion implantation.

* * * * *